US012628426B2

(12) United States Patent
Xu

(10) Patent No.: US 12,628,426 B2
(45) Date of Patent: May 12, 2026

(54) DISPLAY DEVICES

(71) Applicant: Guangzhou China Star Optoelectronics Semiconductor Display Technology Co., LTd., Guangzhou (CN)

(72) Inventor: Qianrui Xu, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 367 days.

(21) Appl. No.: 18/308,573

(22) Filed: Apr. 27, 2023

(65) Prior Publication Data
US 2024/0313002 A1 Sep. 19, 2024

(30) Foreign Application Priority Data
Mar. 17, 2023 (CN) ......................... 202310269813.X

(51) Int. Cl.
H10D 86/60 (2025.01)
H10D 86/40 (2025.01)

(52) U.S. Cl.
CPC ........... H10D 86/60 (2025.01); H10D 86/441 (2025.01)

(58) Field of Classification Search
CPC .............................. H10D 86/60; H10D 86/441
USPC .......................................................... 257/59
See application file for complete search history.

(56) References Cited

U.S. PATENT DOCUMENTS

2012/0139125 A1* 6/2012 Kang ...................... H01L 24/32
257/777
2021/0125566 A1 4/2021 Yang

FOREIGN PATENT DOCUMENTS

| CN | 103383512 A | 11/2013 |
| CN | 109493726 A | 3/2019 |
| CN | 113178132 A | 7/2021 |
| CN | 113589893 A | 11/2021 |

OTHER PUBLICATIONS

Chinese Office Action issued in corresponding Chinese Patent Application No. 202310269813.X dated Jan. 14, 2026, pp. 1-10.

* cited by examiner

*Primary Examiner* — Ori Nadav
(74) *Attorney, Agent, or Firm* — PV IP PC; Peter Stecher; Wei Te Chung

(57) ABSTRACT

A display device is provided. The display device includes a first metal layer and a second metal layer. A projection of a first driver chip on a plane where a first gold finger is located partially overlaps a projection of a second driver chip on the plane where the first gold finger is located. Metal traces for connecting the first gold finger, the second gold finger, and a driver chip including the first driver chip and the second driver chip include a first metal trace, a second metal trace, a third metal trace, a fourth metal trace, and a fifth metal trace. At least one of the first metal trace, the second metal trace, the third metal trace, the fourth metal trace, and the fifth metal trace includes partial wires arranged in a different metal layer than other wires.

13 Claims, 7 Drawing Sheets

FIG. 1--Prior Art--

2
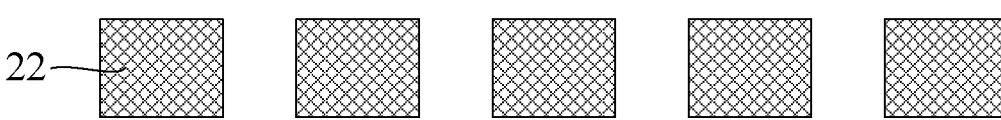
22
L3
231
L2
232
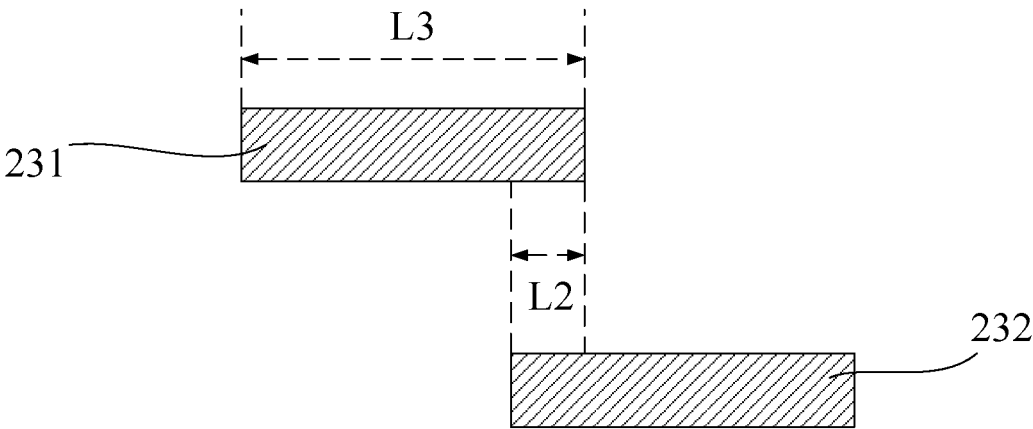
21
231
232 } 23
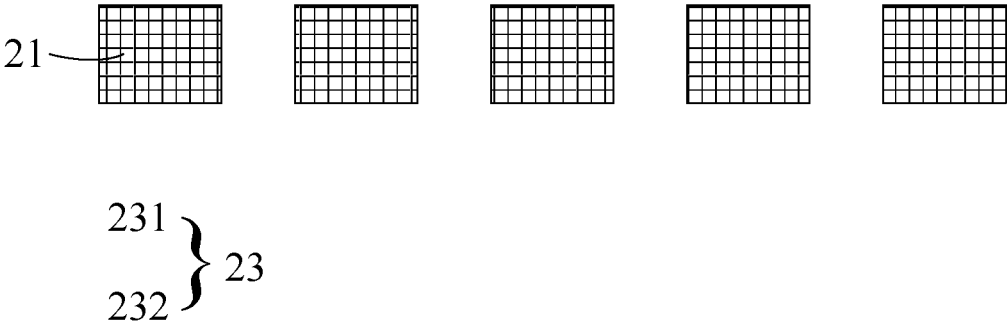
FIG. 7

DISPLAY DEVICES

CROSS-REFERENCE TO RELATED APPLICATION

This application claims priority to Chinese Patent Application No. 202310269813.X, filed on Mar. 17, 2023, the disclosure of which is incorporated herein by reference in its entirety.

TECHNICAL FIELD

The present disclosure relates to the technical field of display technologies, and in particular, to display devices.

BACKGROUND

Chip on film (COF for short) is a grain-soft film packaging technology in which at least one display driver chip is fixed on a flexible circuit board. With the development of display devices towards high resolution, in order to relieve a channel number limitation of a single display driver chip, the display device in related art adopts a two-in-one COF design, that is, two display driver chips are bonded on a single flexible circuit board, so as to arrange more display driver chips in a limited panel bonding area and improve the resolution of the display device. Specifically, the two display driver chips of the two-in-one COF in the related art are laterally arranged, and then the display driver chips and gold fingers are connected through wires. However, because pins of the display driver chip are disposed on an upper side and a lower side thereof, partial wires which are connected to an output end need to be each looped from the lower side of the display driver chip to the gold finger on the output end, resulting in a certain space between adjacent display driver chips. In addition, due to a large width of the display driver chip, a width of the COF is large, so that the number of COFs that the display device can bond is less, and it is not possible to further increase the resolution of the display device.

Therefore, the display device in the related art has a technical problem that the COF has a large width due to a large lateral space occupied by the display driver chips and the wires.

SUMMARY

In view of above, a display device according to embodiments of the present disclosure is provided. The display device includes a display panel, at least one COF, and a printed circuit board. The COF includes a first gold finger connected to the printed circuit board, a second gold finger arranged opposite to the first gold finger and connected to the display panel, a driver chip disposed between the first gold finger and the second gold finger and including a first driver chip and a second driver chip, and metal traces including a first metal trace, a second metal trace, a third metal trace, a fourth metal trace, and a fifth metal trace insulated from each other. The first metal trace includes an end connected to the first gold finger and another end connected to the first driver chip, the second metal trace includes an end connected to the first driver chip and another end connected to the second gold finger, the third metal trace includes an end connected to the first gold finger and another end connected to the second driver chip, the fourth metal trace includes an end connected to the second driver chip and another end connected to the second gold finger, and the fifth metal trace includes an end connected to the first gold finger and another end connected to the second gold finger.

Herein, the COF includes a first metal layer and a second metal layer. Along a direction from the first gold finger towards the second gold finger and on a plane where the first gold finger is located, a projection of the first driver chip partially overlaps a projection of the second driver chip. At least one of the first metal trace, the second metal trace, the third metal trace, the fourth metal trace, and the fifth metal trace includes at least partial wires each arranged in the first metal layer; and at least one of the first metal trace, the second metal trace, the third metal trace, the fourth metal trace, and the fifth metal trace includes at least partial wires each arranged in the second metal layer.

BRIEF DESCRIPTION OF THE DRAWINGS

FIG. 7 is a schematic view of a fifth structure of a COF according to an embodiment of the present disclosure.

DETAILED DESCRIPTION

Figure 1:
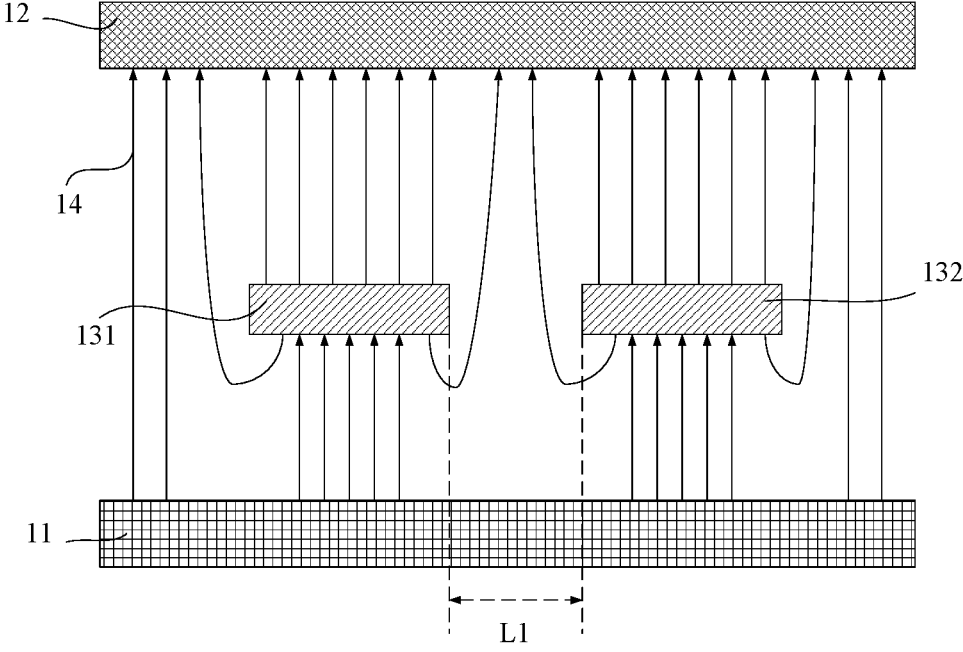
FIG. 1 is a schematic view of a chip on film (COF for short) in the related art.

Some embodiments of the present disclosure will be described below in detail with reference to the accompanying drawings, but not intended to limit the present disclosure.

In the illustration of the present disclosure, it should be understood that orientation and positional relationships indicated by the terms "center", "longitudinal", "transverse", "length", "width", "thickness", "upper", "lower", "front", "back", "left", "right", "vertical", "horizontal", "lateral", "top", "bottom", "inner", "outer", "clockwise", "counterclockwise", etc. are based on the orientation or positional relationship shown in the drawings, which is only for the convenience of illustrating the present disclosure and simplifying the description, rather than indication or implies that the device or component must have a specific orientation to a specific orientation configuration and operation, and therefore should not be construed as limiting the present disclosure.

In addition, the terms, such as "first", "second", "third", "fourth", and so on, are only used for descriptive purposes and cannot be understood as indicating or implying relative importance or implicitly indicating the number of indicated technical features.

As illustrated in FIG. 1, a chip on film (COF for short) includes a signal input end 11 and a signal output end 12 each provided with a plurality of gold fingers thereon (not shown in FIG. 1). The signal input end 11 is bonded to a circuit board through the gold fingers to input signals, and the signal output end 12 is bonded to a display panel through the gold fingers to output signals. In order to improve resolution and relieve a channel number limitation of a single display driver chip, the display device in the related art adopts a two-in-one COF design. As illustrated in FIG. 1, the COF includes a first display driver chip 131 and a second display driver chip 132 each connected with the signal input end 11 and the signal output end 12 through wires 14.

As illustrated in FIG. 1, in order to increase the number of pins of the display driver chip, the pins of the display driver chip are disposed on an upper side and a lower side thereof. In this way, when the first display driver chip 131 and the second display driver chip 132 are connected with the signal output end 12, partial wires 14 need to be each looped back to the signal output end 12 from the lower side of the first display driver chip 131 or the second display driver chip 132. In order to avoid short circuit between the wires 14, it is necessary to reserve a certain space between the first display driver chip 131 and the second display driver chip 132, for example, a distance L1 between the first display driver chip 131 and the second display driver chip 132 shown in FIG. 1 is not less than 6 mm, resulting in a large lateral space occupied by the first display driver chip 131 and the second display driver chip 132. In addition, as illustrated in FIG. 1, in order to avoid the short circuit between the wires 14, the wires 14 each have a certain distance from other wires 14. For example, the signal lines directly connected with the signal input end 11 and the signal output end 12 need to be arranged on a periphery and each have the certain distance from other wires 14, which further increases a width of the COF, resulting in a large width of the COF. Therefore, the display device in the related art has the technical problem that the COF has a large width due to a large lateral space occupied by the display driver chips and the wires.

Figure 2:
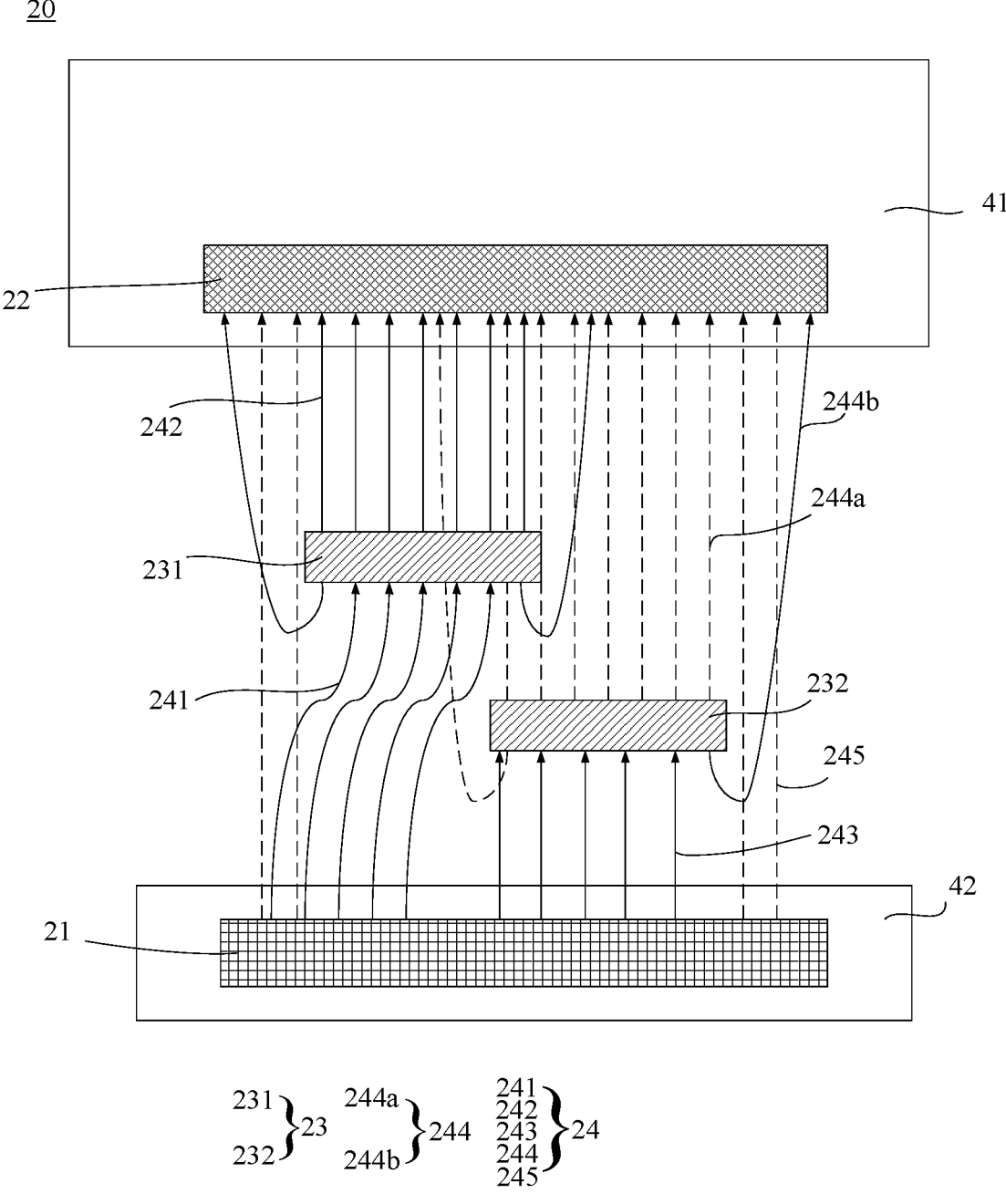
FIG. 2 is a schematic structure view of a display device according to an embodiment of the present disclosure.
Figure 3:
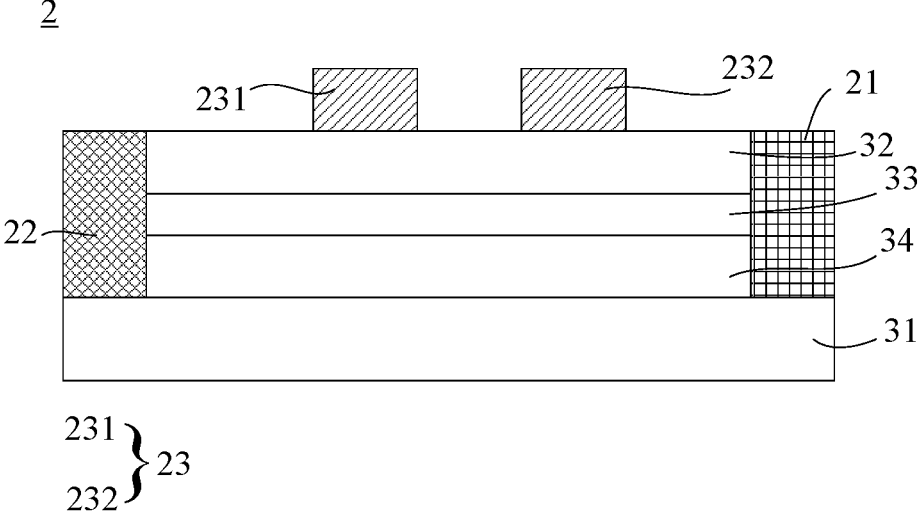
FIG. 3 is a schematic view of a first structure of a COF according to an embodiment of the present disclosure.

As illustrated in FIG. 2 and FIG. 3, a display device according to an embodiment of the present disclosure is provided. The display device 20 includes a display panel 41, at least one COF 2, and a printed circuit board 42. The COF 2 includes a first gold finger 21 connected to the printed circuit board 42, a second gold finger 22 arranged opposite to the first gold finger 21 and connected to the display panel 41, a driver chip 23 disposed between the first gold finger 21 and the second gold finger 22 and including a first driver chip 231 and a second driver chip 232, and metal traces 24 including a first metal trace 241, a second metal trace 242, a third metal trace 243, a fourth metal trace 244, and a fifth metal trace 245 insulated from each other.

Herein, an end of the first metal trace 241 is connected to the first gold finger 21, and another end of the first metal trace 241 is connected to the first driver chip 231; an end of the second metal trace 242 is connected to the first driver chip 231, and another end of the second metal trace 242 is connected to the second gold finger 22; an end of the third metal trace 243 is connected to the first gold finger 21, and another end of the third metal trace 243 is connected to second driver chip 232; an end of the fourth metal trace 244 is connected to the second driver chip 232, and another end of the fourth metal trace 244 is connected to the second gold finger 22; and an end of the fifth metal trace 245 is connected to the first gold finger 21, and another end of the fifth metal trace 245 is connected to the second gold finger 22.

It should be note that, each of the first metal trace 241, the second metal trace 242, the third metal trace 243, the fourth metal trace 244, and the fifth metal trace 245 may include a plurality of wires (referring to sub-lines below). When two ends of each metal trace (referring to each of the first metal trace 241, the second metal trace 242, the third metal trace 243, the fourth metal trace 244, and the fifth metal trace 245) are connected to two ones of the first gold finger, the second gold finger, the first driver chip, and the second driver chip, respectively, it means that two ends of each wire of the corresponding metal trace are connected to the corresponding two ones, respectively.

Herein, the COF 2 includes a first metal layer 32 and a second metal layer 34. Along a direction from the first gold finger 21 towards the second gold finger 22 and on a plane where the first gold finger 21 is located (for example, a vertical plane from top to bottom in FIG. 3), a projection of the first driver chip 231 partially overlaps a projection of the second driver chip 232. At least one of the first metal trace 241, the second metal trace 242, the third metal trace 243, the fourth metal trace 244, and the fifth metal trace 245 includes at least partial wires each arranged in the first metal layer 32 (for example, the wires of the first metal trace 241 shown in FIG. 2 are each arranged in the first metal layer 32); and at least one of the first metal trace 241, the second metal trace 242, the third metal trace 243, the fourth metal trace 244, and the fifth metal trace 245 includes at least partial wires each arranged in the second metal layer 34 (for example, the wires of the fifth metal trace 245 shown in FIG. 2 are each arranged in the second metal layer 34).

According to the embodiment of the present disclosure, the COF 2 includes the first metal layer 32 and the second metal layer 34, and the projection of the first driver chip 231 on the plane where the first gold finger 21 is located partially overlaps the projection of the second driver chip 232 on the plane where the first gold finger 21 is located, so a lateral space occupied by the driver chips decreases. Because at least one of the first metal trace 241, the second metal trace 242, the third metal trace 243, the fourth metal trace 244, and the fifth metal trace 245, which are configured to connect the first gold finger 21, the second gold finger 22, and the driver chip 23, includes at least partial wires arranged in a different metal layer than other wires, a problem of short circuit caused by crossing of the wires connected to the first driver chip 231 and the second driver chip 232 can be avoided. In addition, overlapped wires can be arranged in different metal layers to decrease the reserved space, so that a width of the COF decreases, more COFs can be arranged in the display device, and the resolution of the display device can be improved.

It should be noted that, in the description of the projection of the first driver chip 231 on the plane where the first gold finger 21 is located, the plane where the first gold finger 21 is located refers to a plane in a thickness direction of the first gold finger 21, refers to a plane passing through a back side of the COF to a front side of the COF in FIG. 2, and refers to a plane from top to bottom in FIG. 3.

It should be noted that, that at least one of the first metal trace 241, the second metal trace 242, the third metal trace 243, the fourth metal trace 244, and the fifth metal trace 245 includes at least partial wires each arranged in the first metal layer 32 refers to that, among the first metal trace 241, the second metal trace 242, the third metal trace 243, the fourth metal trace 244, and the fifth metal trace 245, partial wires of at least one metal trace are each arranged in the first metal layer 32. For example, the fourth metal trace 244 in FIG. 2 includes partial wires each arranged in the first metal layer 32 and another partial wires each arranged in the second metal layer 34. For example, the wires of the first metal trace 241 in FIG. 2 are all arranged in first metal layer 32. Similarly, that at least one of the first metal trace 241, the second metal trace 242, the third metal trace 243, the fourth metal trace 244, and the fifth metal trace 245 includes at least partial wires each arranged in the second metal layer 34 refers to that, among the first metal trace 241, the second metal trace 242, the third metal trace 243, the fourth metal trace 244, and the fifth metal trace 245, partial wires of at least one metal trace are each arranged in the second metal layer.

It should be noted that, in order to facilitate the distinction of the wires arranged in the first metal layer 32 and the wires arranged in the second metal layer 34, in the figures according to embodiments of the present disclosure, each of the wires arranged in the first metal layer 32 is shown as a solid line, and each of the wires arranged in the second metal layer 34 is shown as a dashed line. For example, in FIG. 2, the wires of the first metal trace 241 are arranged in the first metal layer 32, so the wires of the first metal trace 241 are each shown as the solid line; and the wires of the fifth metal trace 245 are arranged in the second metal layer 34, so the wires of the fifth metal trace 245 are each shown as the dashed line.

It should be noted that, in order to distinct different wires, in the figures according to embodiments of the present disclosure, an arrow indicates one end of the wire. For example, in FIG. 2, partial wires of the fourth metal trace 244 are obscured by the first driver chip 231, but it is understandable that, an end of each obscured wire is connected to the second gold finger 22, so that each wire can be identified.

It should be noted that, in order to facilitate the description of the wires, specific structures of the first gold finger and the second gold finger are not shown in FIG. 2 to FIG. 6. In actual designs, as illustrated in FIG. 7, each of the first gold finger and the second gold finger includes a plurality of gold fingers insulated from each other to avoid signal interference. It is understandable that, each of the wires connected with the first gold finger and the second gold finger is separately connected to one of the gold fingers.

In view of the problem that the wires arranged in different metal layers cannot be connected to the gold fingers, according to an embodiment, as illustrated in FIG. 2 and FIG. 3, the COF 2 further includes a base 31 disposed on a side of the second metal layer 34 away from the first metal layer 32 and an insulation layer 33 sandwiched between the first metal layer 32 and the second metal layer 34.

Herein, the driver chip 23 is disposed on a side of the first metal layer 32 away from the second metal layer 34, and the first gold finger 21 and the second gold finger 22 are disposed on a side of the base 31 adjacent to the driver chip 23. The first gold finger 21 is connected with the wires arranged in the second metal layer 34 by passing through via holes of the insulation layer 33, and the second gold finger 22 is connected with the wires arranged in the second metal layer 34 by passing through another via holes of the insulation layer 33. When the first gold finger 21 and the second gold finger 22 are arranged, in order to make the first gold finger 21 and the second gold finger 22 connect with the wires in the second metal layer 34, the insulation layer 33 are provided with via holes defined thereon, the first gold finger 21 and the second gold finger 22 are configured to pass through the via holes to connect the wires in the second metal layer 34, thereby enabling a normal operation of the COF 2.

Optionally, a side of the first gold finger 21 away from the base 31 is bonded to the printed circuit board 42, and a side of the second gold finger 22 away from the base 31 is bonded to the display panel 41.

Figure 4:
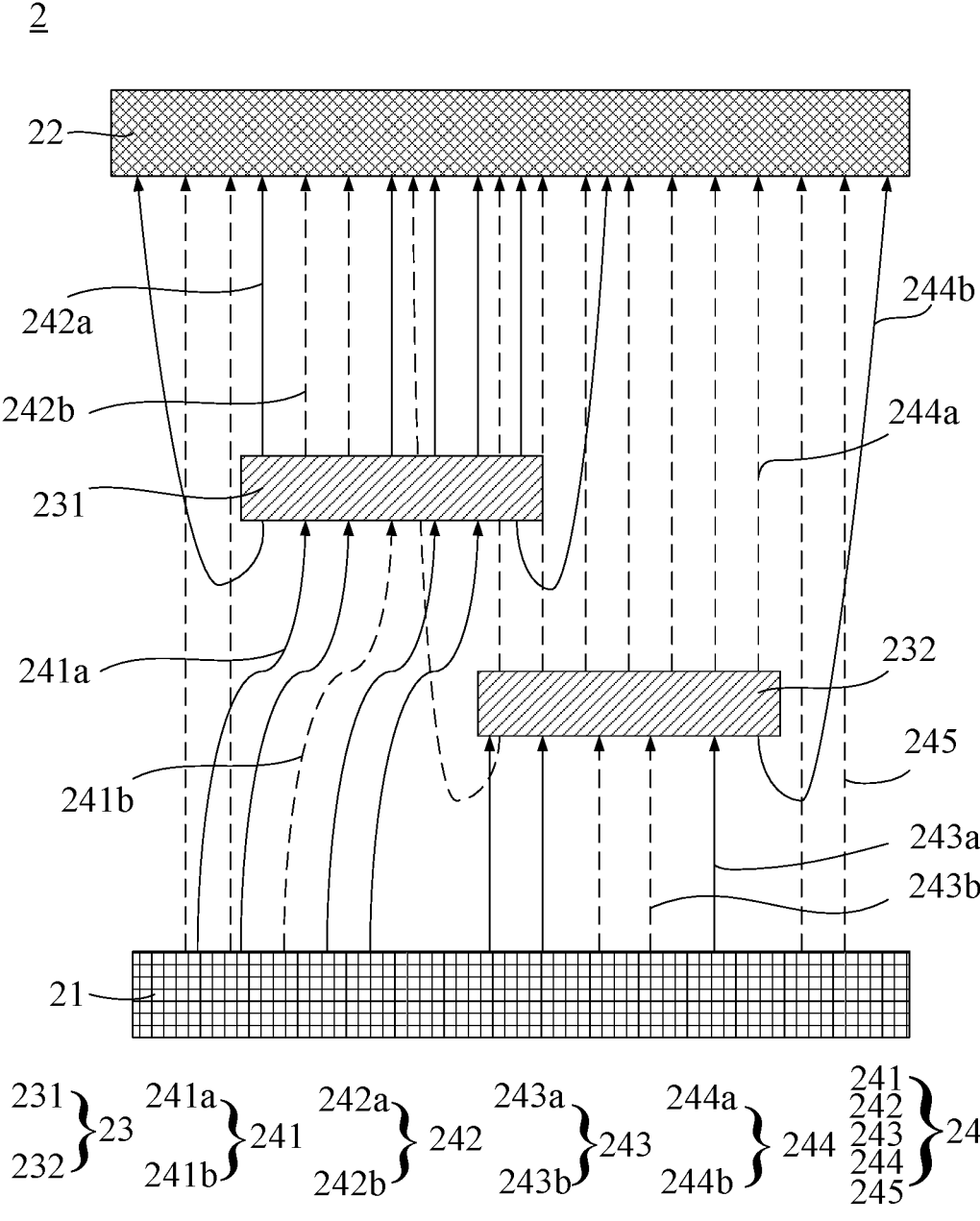
FIG. 4 is a schematic view of a second structure of a COF according to an embodiment of the present disclosure.

According to an embodiment, as illustrated in FIG. 3 and FIG. 4, the first metal trace 241 at least includes first sub-lines 241*a* arranged in the first metal layer 32. A projection of an end, which is connected to the first driver chip 231, of the first sub-line 241*a* on the plane where the first gold finger is located is spaced apart from another end of the first sub-line 241*a* connected with the first gold finger 21. In this way, two ends of the first sub-line are not in a same line perpendicular to the plane where the first gold finger 21 is located, so when the first sub-lines 241*a* of the first metal layer 241 are arranged, each of the first sub-lines 241*a* is arranged to give place to the second driver chip 232, thereby avoiding short circuit between the first sub-line 241*a* and the pin of the second driver chip 232 and avoiding short circuit between the first sub-line 241*a* and the wire connecting the second driver chip 232, and then enabling the normal operation of the COF 2.

As illustrated in FIG. 4, a projection of the first driver chip 231 and a projection of the second driver chip 232 on a side of the COF 2 are overlapped. When the first sub-lines 241*a* are arranged in the first metal layer 32, in order to avoid the short circuit between the first sub-line 241*a* and the pin of the second driver chip 232, and to avoid the short circuit between the first sub-line 241*a* and the wire connecting the second driver chip 232, two ends of the first sub-line 241*a* according to the embodiment of the present disclosure are not in the same line perpendicular to the plane where the first gold finger 21 is located, so that the first sub-line 241*a* is designed as a curve to give place to the second driver chip 232, thereby improving the yield of the COF.

In view of the problems of short distance between adjacent wires and large resistance when the wires of the first metal trace 241 are all arranged in the first metal layer 32, according to an embodiment, as illustrated in FIG. 3 and FIG. 4, the first metal trace 241 further includes one or more second sub-lines 241*b* arranged in the second metal layer 34. A projection of the first sub-line 241*a* on the base 31 is disposed on a side of a projection of the second sub-line 241*b* on the base 31, and the side herein is adjacent to a projection of the second driver chip 232 on the base 31; or the projection of the second sub-line 241*b* on the base 31 is disposed between adjacent projections of the first sub-lines 241*a* on the base 31. A length of the first sub-line 241*a* is greater than or equal to a length of the second sub-line 241*b*. By arranging the second sub-lines 241*b* of the first metal trace 241 in the second metal layer 34, the distance between adjacent first sub-lines 241*a* may increase, a distance between adjacent second sub-line 241*b* may increase, and/or a width of the first sub-line 241*a* and a width of the second sub-line 241*b* may increase, thereby reducing the risk of short circuit between the wires of the first metal trace 241, reducing the risk of disconnection of the first metal trace 241, and decreasing the resistance of the first metal trace 241.

As illustrated in FIG. 4, because the second sub-lines 241*b* are arranged in the second metal layer 34 and the first sub-lines 241*a* are arranged in the first metal layer 32, even if there is a cross or overlap between the projection of the first sub-line 241*a* and the projection of the second sub-lines 241*b* on the base 31, there is no short circuit between the first sub-line 241*a* and the second sub-line 241*b*. In this way, the distance between adjacent first sub-lines 241*a* can increase, the distance between adjacent second sub-lines 241*b* can increase, and the width of the first sub-line 241*a* and the width of the second sub-line 241*b* can increase, thereby avoiding the short circuit between the wires of the first metal trace 241, reducing the risk of disconnection of the first metal trace 241, and decreasing the resistance of the first metal trace 241.

As illustrated in FIG. 4, on the basis of foregoing, the first sub-line 241*a* may also be changed as a straight line instead of the curve to decrease the resistance thereof.

As illustrated in FIG. 4, the projection of the second sub-line 241*b* on the base 31 is disposed between adjacent projections of the first sub-lines 241*a* on the base 31, but the embodiments of the present disclosure are not limited thereto. For example, the wires of the first metal trace 241 each having the projection on the base 31 overlapped with a projection of the fifth metal trace 245 on the base 31 are arranged in the second metal layer 34, and the wires of the fifth metal trace 245 each having the projection on the base 31 overlapped with a projection of the first metal trace 241 on the base 31 are arranged in the first metal layer 32, in this way, the projection of the first sub-line 241*a* on the base 31 is disposed on the side, adjacent to the projection of the second driver chip 232 on the base 31, of the projection of the second sub-line 241*b* on the base 31.

When the wires of the first metal trace 241 are arranged, the wires may be all arranged in the first metal layer 32, as illustrated in FIG. 2. The wires may also be partially arranged in the first metal layer 32 and partially arranged in the second metal layer 34, as illustrated in FIG. 4.

In view of the problems that, when partial wires of the fourth metal trace 244 are arranged in the first metal layer 32, there is short circuit between the wire of the fourth metal trace 244 and the pin of the first driver chip 231, and there is short circuit between the wire of the fourth metal trace 244 and other wire connecting the first driver chip 231, according to an embodiment of the present disclosure, as illustrated in FIG. 3 and FIG. 4, the fourth metal trace 244 at least includes third sub-line 244*a* arranged in the second metal layer 34. At least partial wires of the third sub-lines 244*a* each have a projection on the base 31 overlapped with a projection of one wire of the first sub-lines 241*a* on the base 31. By making the projection of the third sub-line 244*a* on the base 31 overlap the projection of the first sub-line 241*a* on the base 31, there is no need to reserve the space between the third sub-line 244*a* and the first sub-line 241*a*, so that the width of the COF decreases and a rate of space utilization of the COF is improved. In addition, because the third sub-lines 244*a* are arranged in the second metal layer, a contradiction between the third sub-line 244*a* and the first driver chip 231 is avoided, the short circuit between the third sub-line 244*a* and the wire connecting the first driver chip 231 is avoided, and the yield of the COF is improved.

As illustrated in FIG. 4, partial wires of the third sub-lines 244*a* are looped back to the second gold finger 22 from a lower side of the second driver chip 232. In order to avoid short circuit between the looped wire of the third sub-lines 244*a* and the first sub-line 241*a* and to avoid contradiction between the looped wire of the third sub-lines 244*a* and the first driver chip 231, the third sub-lines 244*a* are arranged in the second metal layer 34, thereby improving the yield of the COF. In addition, because there is a cross between the projection of the third sub-line 244*a* and the projection of the first sub-line 241*a* on the base 31, the lateral space occupied by the first metal trace 241 and the fourth metal trace 244 decreases and the width of the COF decreases, so that more COFs can be arranged in the display device, and the resolution of the display device can be improved.

In view of the problems of short distance between adjacent wires and large resistance when the wires of the fourth metal trace 244 are all arranged in the second metal layer 34, according to an embodiment, as illustrated in FIG. 3 and FIG. 4, the fourth metal trace 244 further includes one or more fourth sub-lines 244*b* arranged in the first metal layer 32. A projection of the fourth sub-line 244*b* on the base 31 is disposed on a side of the projection of the third sub-line 244*a* on the base 31, and the side here is away from the projection of the first driver chip 231 on the base 31. By arranging the fourth sub-lines 244*b* of the fourth metal trace 244 in the first metal layer 32, a distance between adjacent third sub-lines 244*a* may increase, a distance between adjacent fourth sub-lines 244*b* may increase, and/or a width of the third sub-line 244*a* and a width of the fourth sub-line 244*b* may increase, thereby reducing the risk of short circuit between the wires of the fourth metal trace 244, reducing the risk of disconnection of the fourth metal trace 244, and decreasing the resistance of the fourth metal trace 244.

As illustrated in FIG. 4, because the fourth sub-lines 244*b* are arranged in the first metal layer 32 and the third sub-lines 244*a* are arranged in the second metal layer 34, even if there is a cross or overlap between the projection of the third sub-line 244*a* and the projection of the fourth sub-line 244*b* on the base 31, there is no short circuit between the third sub-line 244*a* and the fourth sub-line 244*b*. In this way, the distance between adjacent third sub-lines 244*a* can increase, the distance between adjacent fourth sub-lines 244*b* can increase, and the width of the third sub-line 244*a* and the width of the fourth sub-line 244*b* can increase, thereby reducing the risk of short circuit between the wires of the fourth metal trace 244, reducing the risk of disconnection of the fourth metal trace 244, and decreasing the resistance of the fourth metal trace 244.

Only one fourth sub-line 244*b* is shown in FIG. 4, but it is understandable that, when the projection of the wire of the fourth metal trace 244 on the base 31 does not overlap the projections of other wires and the driver chips on the base 31, the wire may be arranged in the first metal layer 32 or in the second metal layer 34, so that the fourth sub-line 244*b* can include a plurality of wires.

Figure 5:
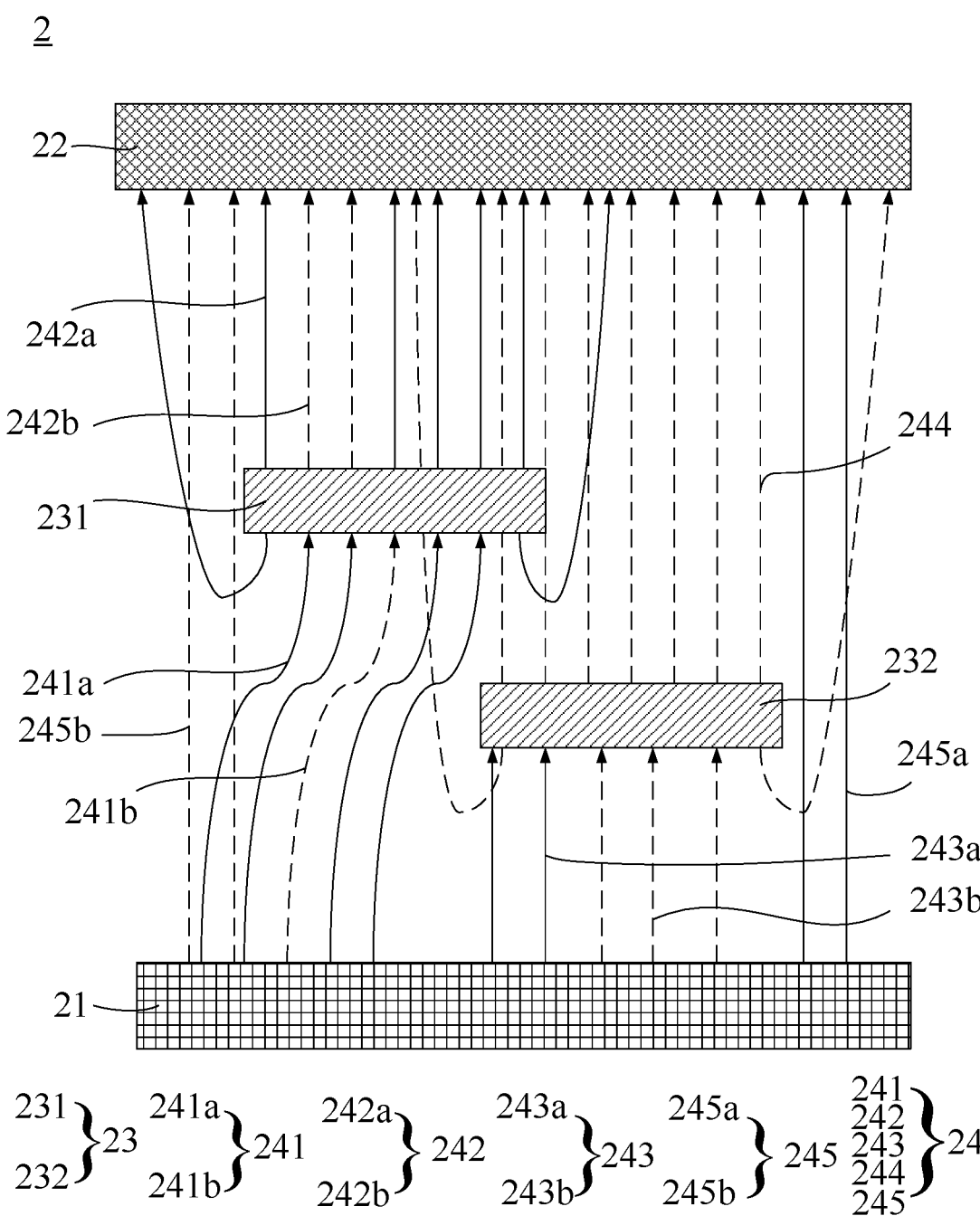
FIG. 5 is a schematic view of a third structure of a COF according to an embodiment of the present disclosure.

The wires of the fourth metal trace 244 may be each arranged in the second metal layer 34, as illustrated in FIG. 5. The wires of the fourth metal trace 244 may also be partially arranged in the first metal layer 32 and partially arranged in the second metal layer 34, as illustrated in FIG. 4.

When the projection of the first driver chip 231 and the projection of the second driver chip 232 on the side of the COF are overlapped, each of partial wires of the second metal trace 242 may have a projection on the base 31 crossed or overlapped with a projection of one of partial wires of the fourth metal trace 244, resulting in short circuit between the second metal trace 242 and the fourth metal trace 244. According to an embodiment, as illustrated in FIG. 3 and FIG. 4, the second metal trace 242 at least includes fifth sub-line 242*a* arranged in the first metal layer 32. At least partial wires of the fifth sub-lines 242*a* each have a projection on the base 31 overlapped with a projection of one wire of the third sub-lines 244*a* on the base 31. By arranging the fifth sub-lines 242*a* in the first metal layer 32, the fifth sub-line 242*a* and the third sub-line 244*a* can be arranged in different layers, so that short circuit between the fifth sub-line 242*a* and the third sub-line 244*a* can be avoided, and the yield of the COF can be improved.

As illustrated in FIG. 4, partial wires of the fifth sub-lines 242*a* are looped back to the second gold finger 22 from a lower side of the first driver chip 231, and the looped wire of the fifth sub-lines 242*a* has a projection on the base 31 crossed or overlapped with the projection of the third sub-line 244*a* on the base 31. According to the embodiment of the present disclosure, by arranging the fifth sub-line 242*a* and the third sub-line 244*a* in different layers, the short circuit between the fifth sub-line 242*a* and the third sub-line 244*a* is avoided, and the yield of the COF is improved.

In view of the problems of short distance between adjacent wires and large resistance when the wires of the second metal trace 242 are all arranged in the first metal layer 32, according to an embodiment, as illustrated in FIG. 3 and FIG. 4, the second metal trace 242 further includes one or more sixth sub-lines 242b arranged in the second metal layer 34. A projection of the sixth sub-line 242b on the base 31 is disposed on a side of the projection of the fifth sub-line 242a on the base 31, and the side here is away from the projection of the second driver chip 232 on the base 31; or the projection of the sixth sub-line 242b on the base 31 is disposed between adjacent projections of the fifth sub-lines 242a on the base 31. By arranging the sixth sub-lines 242b in the second metal layer, a distance between adjacent fifth sub-lines 242a may increase, a distance between adjacent sixth sub-line 242b may increase, and/or a width of the fifth sub-line 242a and a width of the sixth sub-line 242b may increase, thereby reducing the risk of short circuit between the wires of the second metal trace 242, reducing the risk of disconnection of the second metal trace 242, and decreasing the resistance of the second metal trace 242.

As illustrated in FIG. 4, because the fifth sub-lines 242a are arranged in the first metal layer 32 and the sixth sub-lines 242b are arranged in the second metal layer 34, even if there is a cross or overlap between the projection of the fifth sub-line 242a and the projection of the sixth sub-line 242b on the base 31, there is no short circuit between the fifth sub-line 242a and the sixth sub-line 242b. In this way, the distance between adjacent fifth sub-lines 242a can increase, the distance between adjacent sixth sub-lines 242b can increase, and/or the width of the fifth sub-line 242a and the width of the sixth sub-line 242b can increase, thereby reducing the risk of short circuit between the wires of the second metal trace 242, reducing the risk of disconnection of the second metal trace 242, and decreasing the resistance of the second metal trace 242.

Optionally, the wires of the second metal trace 242 may be each arranged in the first metal layer 32, as illustrated in FIG. 2; the wires of the second metal trace 242 may also be partially arranged in first metal layer 32 and partially arranged in the second metal layer 34, as illustrated in FIG. 4.

As illustrated in FIG. 4, the projection of the sixth sub-line 242b on the base 31 is disposed between adjacent projections of the fifth sub-lines 242a on the base 31, but the embodiments of the present disclosure are not limited thereto. For example, the wires of the second metal trace 242 each having the projection on the base 31 overlapped with a projection of the fifth metal trace 245 on the base 31 are arranged in the second metal layer 34, in this way, the projection of the sixth sub-line 242b on the base 31 is disposed on the side, away from the projection of the second driver chip 232 on the base 31, of the projection of the fifth sub-line 242a on the base 31.

According to an embodiment, as illustrated in FIG. 3 and FIG. 4, the third metal trace 243 at least includes seventh sub-line 243a arranged in the first metal layer 32. At least partial wires of the seventh sub-lines 243a each have a projection on the base 31 overlapped with a projection of one wire of the third sub-lines 244a on the base 31. By making the projection of the seventh sub-line 243a on the base 31 overlap the projection of the third sub-line 244a on the base 31, a distance between adjacent seventh sub-line 243a may increase, and/or a width of the seventh sub-line 243a may increase. In addition, because the seventh sub-lines 243a are arranged in the first metal layer 32, short circuit between the seventh sub-line 243a and the third sub-line can be avoided, and the yield of the COF can be improved.

As illustrated in FIG. 4, the projection of the seventh sub-line 243a on the base 31 overlaps the projection of the third sub-line 244a on the base 31, but the embodiments of the present disclosure are not limited thereto. For example, the projection of the seventh sub-line 243a on the base 31 can be designed to not overlap the projection of the third sub-line 244a on the base 31.

According to an embodiment, the third metal trace 243 includes eighth sub-lines 243b arranged in the second metal layer 34. A projection of the eighth sub-line 243b on the base 31 is spaced apart from the projection of the third sub-line 244a on the base 31.

In view of the problems of short distance between adjacent wires and large resistance when the third metal trace 243 only includes the seventh sub-lines 243a or the eighth sub-lines 243b, according to an embodiment, as illustrated in FIG. 3, FIG. 4, and FIG. 5, the third metal trace 243 further includes one or more eighth sub-lines 243b arranged in the second metal layer 34 in addition to the seventh sub-lines 243a. A projection of the eighth sub-line 243b on the base 31 is disposed on a side of the projection of the seventh sub-line 243a on the base 31, and the side is away from the projection of the first driver chip 231 on the base 31; or the projection of the eighth sub-line 243b on the base 31 is disposed between adjacent projections of the seventh sub-lines 243a on the base 31. By arranging the eighth sub-line 243b in the second metal layer, a distance between adjacent seventh sub-lines 243a may increase, a distance between adjacent eighth sub-lines 243b may increase, and/or a width of the seventh sub-line 243a and a width of the eighth sub-line 243b may increase, thereby reducing the risk of short circuit between the wires of the third metal trace 243, reducing the risk of disconnection of the third metal trace 243, and decreasing the resistance of the third metal trace 243.

As illustrated in FIG. 4, because the seventh sub-lines 243a are arranged in the first metal layer 32 and the eighth sub-lines 243b are arranged in the second metal layer 34, even if there is a cross or overlap between the projection of the seventh sub-line 243a and the projection of the eighth sub-line 243b on the base 31, there is no short circuit between the seventh sub-line 243a and the eighth sub-line 243b. In this way, the distance between adjacent seventh sub-lines 243a can increase, the distance between adjacent eighth sub-lines 243b can increase, and/or the width of the seventh sub-line 243a and the width of the eighth sub-line 243b can increase, thereby reducing the risk of short circuit between the wires of the third metal trace 243, reducing the risk of disconnection of the third metal trace 243, and decreasing the resistance of the third metal trace 243.

As illustrated in FIG. 4, the projection of the eighth sub-line 243b on the base 31 is disposed between adjacent projections of the seventh sub-lines 243a on the base 31; as illustrated in FIG. 5, the projection of the eighth sub-line 243b on the base 31 is disposed one the side, away from the projection of the first driver chip 231 on the base 31, of the projection of the seventh sub-line 243a on the base 31.

Optionally, the wires of the third metal trace 243 may be each arranged in the first metal layer 32, as illustrated in FIG. 2; the wires of the third metal trace 243 may also be each arranged in the second metal layer 34; the wires of the third metal trace 243 may also be partially arranged in the first metal layer 32 and partially arranged in the second metal layer 34, as illustrated in FIG. 4.

In view of the problem of large width of the COF when the wires of the fifth metal trace 245 are spaced apart from other wires, according to an embodiment, as illustrated in FIG. 3 and FIG. 4, partial wires of the fifth metal trace 245 each have a projection on the base 31 overlapped with a projection of the second metal trace 242 on the base 31, and/or partial wires of the fifth metal trace 245 each have a projection on the base 31 overlapped with a projection of the fourth metal trace 244 on the base 31. In this way, when the metal traces are arranged, the fifth metal trace 245 does not need to maintain a distance with the second metal trace 242 and/or the fourth metal trace 244, so that the lateral space occupied by the fifth metal trace 245 can decrease and the width of the COF can decrease.

As illustrated in FIG. 1, the wires 14 directly connected to the signal input end 11 and the signal output end 12 are disposed on a left side of the first driver chip 131 and on a right side of the second driver chip 132, and the wires 14 each maintain a certain distance with the first driver chip 131 and on a right side of the second driver chip 132, resulting in large width of the COF. According to embodiments of the present disclosure, partial wires of the fifth metal trace 245 each have a projection on the base 31 overlapped with a projection of the second metal trace 242 on the base 31, and/or partial wires of the fifth metal trace 245 each have a projection on the base 31 overlapped with a projection of the fourth metal trace 244, as illustrated in FIG. 4, so the fifth metal trace 245 can be disposed within the space occupied by the second metal trace 242 and the fourth metal trace 244. In this way, there is no need to provide a separate space for the fifth metal trace 245, the distance between the fifth metal trace 245 and the first driver chip 231 decreases, and the distance between the fifth metal trace 245 and the second driver chip 232 decreases, so that the width of the COF decreases, the rate of space utilization of the COF is improved, more COFs can be bonded to the display panel, and the resolution of the display device can be improved.

The wires of the fifth metal trace 245 may be divided into two parts: each wire in one part may have a projection on the base 31 overlapped with the projection of the second metal trace 242 on the base 31, and each wire in the other part may have a projection on the base 31 spaced apart from the projection of the fourth metal trace 244 on the base 31; or each wire in one part may have a projection on the base 31 overlapped with the projection of the fourth metal trace 244 on the base 31, and each wire in the other part may have a projection on the base 31 spaced apart from the projection of the second metal trace 242 on the base 31; or each wire in one part may have a projection on the base 31 overlapped with the projection of the second metal trace 242 on the base 31, and each wire in the other part may have a projection on the base 31 overlapped with the projection of the fourth metal trace 244 on the base 31.

When the projection of the wire of the fifth metal trace 245 on the base 31 overlaps the projection of the second metal trace 242 on the base 31, the wire of the fifth metal trace 245 having the projection on the base 31 may overlap or be spaced apart from the projection of the first metal trace 241 on the base 31. When the projection of the wire of the fifth metal trace 245 on the base 31 overlaps a projection of one wire of the first metal trace 241 on the base 31, the wire of the fifth metal trace 245 and the wire of the first metal trace 241 are arranged in different metal layers.

Figure 6:
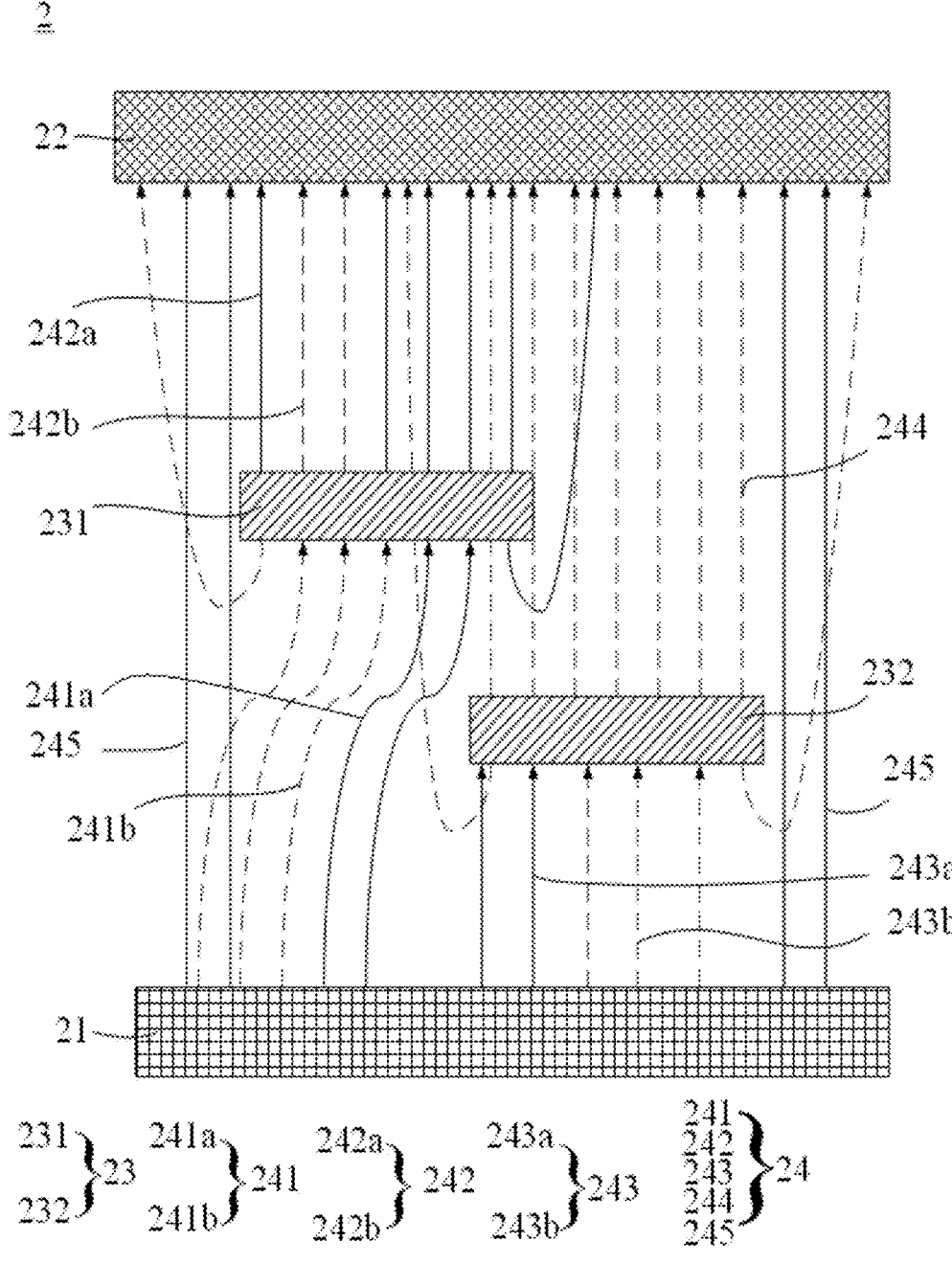
FIG. 6 is a schematic view of a fourth structure of a COF according to an embodiment of the present disclosure.

According to an embodiment, as illustrated in FIG. 3 and FIG. 6, the wires of the fifth metal trace 245 are each arranged in the first metal layer 32; the wires (for example, referring to the sixth sub-line 242b) of the second metal trace

242 each having the projection on the base 31 overlapped with the projection of the fifth metal trace 245 on the base 31 are arranged in the second metal layer 34; and the wires (for example, the wires looped back to the second gold finger 22 from the lower side of the second driver chip 232, shown in FIG. 6) of the fourth metal trace 244 each having the projection on the base 31 overlapped with the projection of the fifth metal trace 245 on the base 31 are arranged in the second metal layer 34. In this way, there is no short circuit between the wire of the fifth metal trace 245 and the wire of the second metal trace 242, and there is no short circuit between the wire of the fifth metal trace 245 and the wire of the fourth metal trace 244, so that the yield of the COF is improved. In addition, the wire of the fifth metal trace 245 is crossed or overlapped with the wire of the second metal trace 242 and the wire of the fourth metal trace 244, so the width of the COF decreases, and the rate of space utilization of the COF is improved.

Optionally, when the wires of the fifth metal trace 245 are each arranged in the first metal layer 32, and the projection of each wire of the fifth metal trace 245 on the base 31 overlaps the projection of one wire of the first metal trace 241 on the base 31, the wire (for example, referring to the second sub-line 241b) of the first metal trace 241 having the projection on the base 31 overlapped with the projection of one wire of the fifth metal trace 245 on the base 31 can be arranged in the second metal layer 34.

According to an embodiment, as illustrated in FIG. 3 and FIG. 4, the wires of the fifth metal trace 245 are each arranged in the second metal layer 34; the wire (for example, referring to the fifth sub-line 242a) of the second metal trace 242 having a projection on the base 31 overlapped with the projection of one wire of the fifth metal trace 245 on the base 31 is arranged in the first metal layer 32; and the wire (for example, referring to the fourth sub-line 244b) of the fourth metal trace 244 having a projection on the base 31 overlapped with the projection of one wire of the fifth metal trace 245 on the base 31 is arranged in the first metal layer 32. In this way, there is no short circuit between the wire of the fifth metal trace 245 and the wire of the second metal trace 242, and there is no short circuit between the wire of the fifth metal trace 245 and the wire of the fourth metal trace 244, so that the yield of the COF is improved. In addition, the wire of the fifth metal trace is crossed or overlapped with the wire of the second metal trace 242 and the wire of the fourth metal trace 244, so the width of the COF decreases, and the rate of space utilization of the COF is improved.

Optionally, when the wires of the fifth metal trace 245 are each arranged in the second metal layer 34, and the projection of each wire of the fifth metal trace 245 on the base 31 overlaps the projection of one wire of the first metal trace 241 on the base 31, the wire (for example, referring to the first sub-line 241a) of the first metal trace 241 having the projection on the base 31 overlapped with the projection of one wire of the fifth metal trace 245 on the base 31 can be arranged in the first metal layer 32.

According to an embodiment, as illustrated in FIG. 3 and FIG. 5, the fifth metal trace 245 includes ninth sub-lines 245a arranged in the first metal layer 32 and tenth sub-lines 245b arranged in the second metal layer 34. One of the ninth sub-line 245a and the tenth sub-line 245b has a projection on the base 31 overlapped with the projection of one wire of the second metal trace 242 on the base 31, and the other one of the ninth sub-line 245a and tenth sub-line 245b has a projection on the base 31 overlapped with the projection of one wire of the fourth metal trace 244 on the base 31. In this way, there is no need to provide a separate space for the fifth metal trace 245, the distance between the fifth metal trace 245 and the first driver chip 231 decreases, and the distance between the fifth metal trace 245 and the second driver chip 232 decreases, so that the width of the COF decreases, the rate of space utilization of the COF is improved, more COFs can be bonded to the display panel, and the resolution of the display device can be improved.

As illustrated in FIG. 5, the projection of the ninth sub-line 245a on the base 31 overlaps the projection of one wire of the fourth metal trace 244 on the base 31, and the projection of the tenth sub-line 245b on the base 31 overlaps the projection of one wire of the second metal trace 242 on the base 31. But the embodiments of the present disclosure are not limited thereto. For example, the projection of the ninth sub-line 245a on the base 31 may overlap the projection of one wire of the second metal trace 242 on the base 31, and the projection of the tenth sub-line 245b on the base 31 may overlap the projection of one wire of the fourth metal trace 244 on the base 31.

As illustrated in FIG. 5, the wire of the fourth metal trace 244 having the projection on the base 31 overlapped with the projection of the ninth sub-line 245a on the base 31 is arranged in the second metal layer 34, and the wire of the second metal trace 242 having the projection on the base 31 overlapped with the projection of the tenth sub-line 245b on the base 31 is arranged in the first metal layer 32.

In view of the problem that, there may be short circuit between the metal traces when the projection of the first driver chip 231 and the projection of the second driver chip 232 on the plane where the first gold finger 21 is located are completely coincident, according to an embodiment, as illustrated in FIG. 7, a coincidence portion of the projection of the first driver chip 231 and the projection of the second driver chip 232 on the plane where the first gold finger 21 is located has a width L2, and the first driver chip 231 has a width L3, where the width L2 ranges from one-tenth to half of the width L3. In this way, the width of the COF decreases, and the circuit shirt between different metal traces is avoided.

Optionally, the width L2 of the coincidence portion may be one-ninth, one-eighth, one-seventh, one-sixth, or one-fifth of the width L3 of the first driver chip 231.

According to an embodiment, the wires of the first metal trace 241 and the third metal trace 243 are P2P data signal input lines each configured to input a point-to-point transmission protocol, and the point-to-point transmission protocol refers to a communication protocol between a timing logic control chip and the driver chip 23. The wires of the second metal trace 242 and the fourth metal trace 244 are RGB data signal output lines each configured to output an output RGB data signal, and the output RGB data signal refers to an analog data signal output to the display panel 41 after decoding by the ADC inside the driver chip 23. The wires of the fifth metal trace 245 are gate driver signal lines each configured to input a gate drive signal directly from the printed circuit board 42 to the display panel 41.

Optionally, in order to ensure the consistency of the gate drive signals on both sides of the display panel 41, the wires of the fifth metal trace 245 can be arranged in a same layer.

At the same time, an electronic device is provided according to embodiments of the present disclosure, and the electronic device includes the display device 20 as described in any of the above embodiments.

According to the above embodiments, it can be noted that: the display device 20 provided according to the embodiments of the present disclosure includes the display panel 41, at least one COF 2, and the printed circuit board 42. The COF 2 includes the first gold finger 21, the second gold finger 22, the driver chip 23, and the metal traces 24. The first gold finger 21 is connected to the printed circuit board 42, the second gold finger 22 is disposed opposite to the first gold finger 21, and the second gold finger 22 is connected to the display panel 41. The driver chip 23 includes the first driver chip 231 and the second driver chip 232. The metal traces 24 include the first metal trace 241, the second metal trace 242, the third metal trace 243, the fourth metal trace 244, and the fifth metal trace 245 insulated from each other. An end of the first metal trace 241 is connected to the first gold finger 21, and another end of the first metal trace 241 is connected to the first driver chip 231. An end of the second metal trace 242 is connected to the first driver chip 231, and another end of the second metal trace 242 is connected to the second gold finger 22. An end of the third metal trace 243 is connected to the first gold finger 21, and another end of the third metal trace 243 is connected to the second driver chip 232. An end of the fourth metal trace 244 is connected to the second driver chip 232, and another end of the fourth metal trace 244 is connected to the second gold finger 22. An end of the fifth metal trace 245 is connected to the first gold finger 21, and another end of the fifth metal trace 245 is connected to the second gold finger 22. Herein, the COF 2 includes the first metal layer 32 and the second metal layer 34. Along the direction from the first gold finger 21 towards the second gold finger 22 and on the panel where the first gold finger 21 is located, the projection of the first driver chip 231 partially overlaps the projection of the second driver chip 232. At least one of the first metal trace 241, the second metal trace 242, the third metal trace 243, the fourth metal trace 244, and the fifth metal trace 245 includes at least partial wires each arranged in the first metal layer 32; and at least one of the first metal trace 241, the second metal trace 242, the third metal trace 243, the fourth metal trace 244, and the fifth metal trace 245 includes at least partial wires each arranged in the second metal layer 34. Because the COF 2 includes the first metal layer 32 and the second metal layer 34, and the projection of the first driver chip 231 on the panel where the first gold finger 21 is located partially overlaps the projection of the second driver chip 232 on the panel where the first gold finger 21 is located, the lateral space occupied by the driver chip 32 decreases. In addition, at least one of the first metal trace 241, the second metal trace 242, the third metal trace 243, the fourth metal trace 244, and the fifth metal trace 245, which are configured to connect the first gold finger 21, the second gold finger 22, and the driver chip 23, includes partial wires arranged in a different metal layer than other wires, so short circuit caused by crossing of the wires connected to the first driver chip 231 and the second driver chip 232 can be avoided. In addition, the overlapped wires can be arranged in different metal layers to decrease the reserved space used for avoiding short circuit and to decrease a width of the COF, so that more COFs can be arranged in the display device, and the resolution of the display device can be improved.

In the above embodiments, the description of each embodiment has its own emphasis. For the part not detailed in one embodiment, please refer to the relevant description of other embodiments.

The display devices according to some embodiments of the present disclosure have been described above in detail. Those skilled in the art can make various changes and modifications without departing from the spirit of the present disclosure. Therefore, the described embodiments are not intended to limit the present disclosure.

What is claimed is:

1. A display device, comprising a display panel, at least one chip on film (COF), and a printed circuit board, and the COF comprising:

a first gold finger connected to the printed circuit board;

a second gold finger arranged opposite to the first gold finger and connected to the display panel;

a driver chip disposed between the first gold finger and the second gold finger and comprising a first driver chip and a second driver chip; and metal traces comprising a first metal trace, a second metal trace, a third metal trace, a fourth metal trace, and a fifth metal trace insulated from each other; and wherein the first metal trace comprises an end connected to the first gold finger and another end connected to the first driver chip, the second metal trace comprises an end connected to the first driver chip and another end connected to the second gold finger, the third metal trace comprises an end connected to the first gold finger and another end connected to the second driver chip, the fourth metal trace comprises an end connected to the second driver chip and another end connected to the second gold finger, and the fifth metal trace comprises an end connected to the first gold finger and another end connected to the second gold finger;

wherein along a direction from the first gold finger towards the second gold finger and on a plane where the first gold finger is located, a projection of the first driver chip partially overlaps a projection of the second driver chip;

wherein the COF comprises a first metal layer and a second metal layer; each of the first metal trace, the second metal trace, the third metal trace, the fourth metal trace, and the fifth metal trace comprises a plurality of wires; at least one of the first metal trace, the second metal trace, the third metal trace, the fourth metal trace, and the fifth metal trace comprises at least some wires, of the plurality of wires, each arranged in the first metal layer; and at least one of the first metal trace, the second metal trace, the third metal trace, the fourth metal trace, and the fifth metal trace comprises at least some wires, of the plurality of wires, each arranged in the second metal layer;

wherein the COF further comprises a base disposed on a side of the second metal layer away from the first metal layer;

wherein the first metal trace comprises first sub-lines arranged in the first metal layer;

wherein a projection of an end, which is connected to the first driver chip, of each first sub-line of the first sub-lines on the plane where the first gold finger is located is spaced apart from another end of the first sub-line connected with the first gold finger;

wherein the fourth metal trace comprises third sub-lines arranged in the second metal layer; and wherein at least some sub-lines of the third sub-lines each have a projection on the base overlapped with a projection of one of the first sub-lines on the base.

2. The display device of claim 1, wherein the COF further comprises:

an insulation layer sandwiched between the first metal layer and the second metal layer; and wherein the driver chip is disposed on a side of the first metal layer away from the second metal layer, the first gold finger is disposed on a side of the base adjacent to the driver chip, and the second gold finger is disposed on the side of the base adjacent to the driver chip; and wherein the first gold finger is connected with wires arranged in the second metal layer by passing through via holes of the insulation layer, and the second gold finger is connected with another wires arranged in the second metal layer by passing through another via holes of the insulation layer.

3. The display device of claim 1, wherein the first metal trace further comprises one or more second sub-lines arranged in the second metal layer;

wherein a projection of each of the first sub-lines on the base is disposed on a side, adjacent to a projection of the second driver chip on the base, of a projection of each of the second sub-lines on the base, or the projection of each of the second sub-lines on the base is disposed between adjacent projections of the first sub-lines on the base; and wherein a length of each of the first sub-lines is greater than or equal to a length of each of the second sub-lines.

4. The display device of claim 1, wherein the fourth metal trace further comprises one or more fourth sub-lines arranged in the first metal layer; and wherein a projection of each of the fourth sub-lines on the base is disposed on a side, away from a projection of the first driver chip on the base, of a projection of each of the third sub-lines on the base.

5. The display device of claim 1, wherein the second metal trace comprises fifth sub-lines arranged in the first metal layer; and wherein at least some sub-lines of the fifth sub-lines each have a projection on the base overlapped with a projection of one of the third sub-lines on the base.

6. The display device of claim 5, wherein the second metal trace further comprises one or more sixth sub-lines arranged in the second metal layer; and wherein a projection of each of the sixth sub-lines on the base is disposed on a side, away from a projection of the second driver chip on the base, of a projection of each of the fifth sub-lines on the base, or the projection of each of the sixth sub-lines on the base is disposed between adjacent projections of the fifth sub-lines on the base.

7. The display device of claim 1, wherein the third metal trace comprises seventh sub-lines arranged in the first metal layer; and wherein at least some sub-lines of the seventh sub-lines each have a projection on the base overlapped with a projection of one of the third sub-lines on the base.

8. The display device of claim 7, wherein the third metal trace further comprises one or more eighth sub-lines arranged in the second metal layer; and wherein a projection of each of the eighth sub-lines on the base is disposed on a side, away from a projection of the first driver chip on the base, of a projection of each of the seventh sub-lines on the base.

9. The display device of claim 1, wherein a coincidence portion of the projection of the first driver chip on the plane where the first gold finger is located and the projection of the second driver chip on the plane where the first gold finger is located has a width ranging from one-tenth to half of a width of the first driver chip.

10. A display device, comprising a display panel, at least one chip on film (COF), and a printed circuit board, and the COF comprising:

a first gold finger connected to the printed circuit board;

a second gold finger arranged opposite to the first gold finger and connected to the display panel;

a driver chip disposed between the first gold finger and the second gold finger and comprising a first driver chip and a second driver chip; and metal traces comprising a first metal trace, a second metal trace, a third metal trace, a fourth metal trace, and a fifth metal trace insulated from each other; and wherein the first metal trace comprises an end connected to the first gold finger and another end connected to the first driver chip, the second metal trace comprises an end connected to the first driver chip and another end connected to the second gold finger, the third metal trace comprises an end connected to the first gold finger and another end connected to the second driver chip, the fourth metal trace comprises an end connected to the second driver chip and another end connected to the second gold finger, and the fifth metal trace comprises an end connected to the first gold finger and another end connected to the second gold finger;

wherein along a direction from the first gold finger towards the second gold finger and on a plane where the first gold finger is located, a projection of the first driver chip partially overlaps a projection of the second driver chip;

wherein the COF comprises a first metal layer and a second metal layer; each of the first metal trace, the second metal trace, the third metal trace, the fourth metal trace, and the fifth metal trace comprises a plurality of wires; at least one of the first metal trace, the second metal trace, the third metal trace, the fourth metal trace, and the fifth metal trace comprises at least some wires, of the plurality of wires, each arranged in the first metal layer; and at least one of the first metal trace, the second metal trace, the third metal trace, the fourth metal trace, and the fifth metal trace comprises at least some wires, of the plurality of wires, each arranged in the second metal layer;

wherein the COF further comprises a base disposed on a side of the second metal layer away from the first metal layer; and wherein at least some wires of the fifth metal trace each have a projection on the base overlapped with a projection of one wire of the second metal trace on the base; or at least some wires of the fifth metal trace each have a projection on the base overlapped with a projection of one wire of the second metal trace on the base, and at least another some wires of the fifth metal trace each have a projection on the base overlapped with a projection of one wire of the fourth metal trace on the base; or at least some wires of the fifth metal trace each have a projection on the base overlapped with a projection of one wire of the fourth metal trace on the base.

11. The display device of claim 10, wherein the fifth metal trace is arranged in the first metal layer;

wherein wires of the second metal trace each having a projection on the base overlapped with a projection of one wire of the fifth metal trace on the base are arranged in the second metal layer; and wherein wires of the fourth metal trace each having a projection on the base overlapped with a projection of one wire of the fifth metal trace on the base are arranged in the second metal layer.

12. The display device of claim 10, wherein the fifth metal trace is arranged in the second metal layer;

wherein wires of the second metal trace each having a projection on the base overlapped with a projection of one wire of the fifth metal trace on the base are arranged in the first metal layer; and wherein wires of the fourth metal trace each having a projection on the base overlapped with a projection of one wire of the fifth metal trace on the base are arranged in the first metal layer.

13. The display device of claim 10, wherein the fifth metal trace comprises ninth sub-lines arranged in the first metal layer and one or more tenth sub-lines arranged in the second metal layer; and wherein a projection of each of the ninth sub-lines on the base overlaps a projection of one wire of the second metal trace on the base, and a projection of each of the tenth sub-lines on the base overlaps a projection of one wire of the fourth metal trace on the base; or the projection of each of the ninth sub-lines on the base overlaps a projection of one wire of the fourth metal trace on the base, and the projection of each of the tenth sub-lines on the base overlaps a projection of one wire of the second metal trace on the base.

* * * * *